(12) United States Patent
Li et al.

(10) Patent No.: US 8,269,263 B2
(45) Date of Patent: Sep. 18, 2012

(54) HIGH CURRENT DENSITY POWER FIELD EFFECT TRANSISTOR

(75) Inventors: Jian Li, Palo Alto, CA (US); King Owyang, Atherton, CA (US)

(73) Assignee: Vishay-Siliconix, Santa Clara, CA (US)

( * ) Notice: Subject to any disclaimer, the term of this patent is extended or adjusted under 35 U.S.C. 154(b) by 386 days.

(21) Appl. No.: 12/119,367

(22) Filed: May 12, 2008

(65) Prior Publication Data
US 2009/0278176 A1    Nov. 12, 2009

(51) Int. Cl.
*H01L 27/105* (2006.01)
(52) U.S. Cl. ............... 257/262; 257/267; 257/E29.265
(58) Field of Classification Search ............... 257/262, 257/263, 267, E29.265, E21.421
See application file for complete search history.

(56) References Cited

U.S. PATENT DOCUMENTS

| | | | | |
|---|---|---|---|---|
| 5,396,085 A | * | 3/1995 | Baliga | 257/77 |
| 5,637,898 A | * | 6/1997 | Baliga | 257/330 |
| 5,661,322 A | * | 8/1997 | Williams et al. | 257/331 |
| 5,844,273 A | | 12/1998 | Konishi | |
| 7,417,266 B1 | * | 8/2008 | Li et al. | 257/135 |
| 2004/0232450 A1 | * | 11/2004 | Yilmaz | 257/213 |
| 2005/0006716 A1 | * | 1/2005 | Kumar et al. | 257/500 |
| 2005/0152080 A1 | * | 7/2005 | Harris et al. | 361/56 |
| 2006/0267090 A1 | * | 11/2006 | Sapp et al. | 257/341 |
| 2007/0045727 A1 | * | 3/2007 | Shiraishi et al. | 257/335 |
| 2007/0278571 A1 | | 12/2007 | Bhalla et al. | |
| 2008/0003731 A1 | | 1/2008 | Mazzola et al. | |
| 2008/0277695 A1 | * | 11/2008 | Li et al. | 257/262 |

FOREIGN PATENT DOCUMENTS
EP    1239523 A2  *  9/2002

OTHER PUBLICATIONS

Murali, R. et al. "Short-Channel Modeling of Bulk Accumulation MOSFETs." IEEE Transactions on Electron Devices, vol. 51, No. 6, pp. 940-947. Jun. 2004.*

Syau, T. et al. "Comparison of Ultralow Specific On-Resistance UMOSFET Structures: The ACCUFET, EXTFET, INVFET, and Conventional UMOSFET's." IEEE Trans. on Electron Devices, vol. 41, No. 5, pp. 800-808 (1994).*

Cheng, X. et al. "Fast Reverse Recovery Body Diode in High-Voltage VDMOSFET Using Cell-Distributed Schottky Contacts." IEEE Trans. on Electron Devices, vol. 50, No. 5, pp. 1422-1425 (2003).*

* cited by examiner

*Primary Examiner* — Tom Thomas
*Assistant Examiner* — Christopher M Roland

(57) ABSTRACT

An ultra-short channel hybrid power field effect transistor (FET) device lets current flow from bulk silicon without npn parasitic. This device does not have body but still have body diode with low forward voltage at high current rating. The device includes a JFET component, a first accumulation MOSFET disposed adjacent to the JFET component, and a second accumulation MOSFET disposed adjacent to the JFET component at the bottom of the trench end, or a MOSFET with an isolated gate connecting the source.

18 Claims, 5 Drawing Sheets

HIGH CURRENT DENSITY POWER FIELD EFFECT TRANSISTOR

TECHNICAL FIELD

The present invention relates to trench based high current density power semiconductor structures made by vertical integration of different kinds of semiconductor devices. Its low forward voltage and on-resistance characteristics at high current allow this normally-off device used as a synchronized rectifier transistor in DC-DC conversion application

BACKGROUND ART

Power MOSFETs (metal-oxide-semiconductor field-effect transistors) comprise one of the most useful field effect transistors implemented in both analog and digital circuit applications as energy saving switches.

In general, a trench-based power MOSFET is built using a vertical structure as opposed to a planar structure. The vertical structure enables the transistor to sustain both high blocking voltage and high current. Similarly, with a vertical structure, the component area and active device density are roughly proportional to the current it can sustain as a device "on" characteristics, and the silicon drift component thickness is proportional to the breakdown voltage as a device "off" characteristics. One the most obvious advantages for trench based power MOSFET device is its lower on-resistance (Rdson) with low reverse leakage current.

As one of the key applications in DC-DC conversion, a power MOSFET device has another advantage when being used as a synchronized rectifier transistor with its p-n body diode in a free-wheeling mode. The use of p-n body diode in conventional power MOSFET plays the role of reverse voltage blocking. However, the reverse recovery from the p-n body diode in the free wheeling mode contributes adversely to the total switching efficiency in DC-DC conversion.

Generally, there are two well-known solutions to reduce reverse recovery effect: 1) using external Schottky device to be co-packaged with power MOSFET; or 2) integrating a lumped Schottky diode in MOSFET to bypass the parasitic body diode as a monolithic approach. Besides those two methods, historically carrier-lifetime-control techniques are employed such as using electron or proton irradiation. These techniques have proven successful in reducing the reverse recovery charge Qrr of the body diode.

However, all these solutions have their own drawbacks. For instance, the external Schottky approach can lead to high inductance, thus leading to less total switching efficiency improvement. On the other hand, a monolithically integrated Schottky approach compromises silicon real estate usage for on-resistance reduction because of certain percentage of silicon area has to be allocated to Schottky integration, and the small area of the integrated Schottky also limits current capability and the forward voltage lowing advantage. The irradiation approach can lead to significant changes in threshold voltage, leakage current and breakdown voltage due to the damage induced by irradiations. From process and product complexity point of view, all these solutions are not economically sound because extra process steps need to be added, such as adding more mask layers in fabricating the devices.

In 2003, Cheng et al. (Xu Cheng, Johnny K. Sin, Baowei Kang, Chuguang Feng, Yu Wu and Xingming Liu, IEEE Transactions on electron devices, Vol. 50, No. 5, (2003). P1422) published a novel device structure to achieve fast reverse recovery body diode using cell-distributed Schottky contacts in high voltage VDMOSFET. Experimental results show a 50% decrease in the reverse recovery charge and increase in the softness factor of the body diode. Both structures are designed for making "intrinsic" Schottky diodes in every active cell. In other words, the Schottky diode and active MOSFET share the same pitch. Due to the process control concern, adding Schottky diode in every active cell limits the possibility for further pitch shrink opportunity, which is the critical direction for reducing on-resistance for power device in low voltage application. This approach provides obvious advantage in high voltage DMOS device (e.g. >500V), which is not sensitive to pitch reduction for lowering Rdson (because of most of on-resistance component is from drift area for high voltage applications). However, in low voltage applications, pitch reduction should not be limited by adding a Schottky device in the active cell. Otherwise, on-resistance becomes high by increasing the pitch. The challenge is how to integrate a Schottky diode in a power device without impacting on-resistance for low voltage device applications.

Baliga et al (Tsengyou Syan, Prasd Venkatraman and B. J. Baliga, IEEE Trans. On Electron Devices, Vol. 41 No. 5 (1994), P800) once proposed accumulation field effect transistor (ACCUFET) as an ultra-low on-resistance vertical channel power device in the mid of 1990s. Since then, several similar device structures have been published. However, high reverse leakage current is the most problematic drawback. It is very hard to achieve "normally-off" characteristics when the gate is grounded. For an n-channel device when an n type gate is used, a negative gate bias is needed to turn-off the device to achieve acceptable reverse voltage blocking. One possible improvement solution is to reduce pitch using deep submicron lithography. However, one major device characteristic different from conventional power MOSFET should not be ignored when ACCUFET is used as power switching device: its bi-directional switching nature shows that the reverse and forward blocking are only kept in a finite duration because of the accumulation of minority carriers, which make the depletion width narrower. This effect limits the effectiveness of blocking capability. As a modified ACCUFET structure proposed by Yoshinori Konishi (U.S. Pat. No. 5,844, 273), a p-n diode can be formed in the no body channel region. The direct connection between this p type to N+ source can help to reduce reverse leakage, however, the low on-resistance and low forward voltage advantages were not achieved.

DISCLOSURE OF THE INVENTION

Embodiments of the present invention implement high density power field effect transistor that avoids the channel mobility problems caused by gate oxide scattering, that exhibits lower forward voltage (Vf) rated at high current; and that shows shorter channel length for faster switching. This invention can apply to DC-DC conversion as a synchronized rectifier transistor.

In one embodiment, the present invention is implemented as a power field effect transistor device. The device includes a Schottky diode formed in a vertical trench contact, a junction FET (JFET) component, a first accumulation MOSFET disposed adjacent to the JFET component, and a second accumulation MOSFET disposed adjacent to the JFET component on the side opposite the first accumulation MOSFET. The JFET component, the vertical Schottky and the first accumulation MOSFET are configured to provide both current path in "on" mode and voltage blocking in "off" mode. The induced current flow through bulk silicon regions of the device is configured to reduce gate oxide scattering. The second accumulation MOSFET, formed near the bottom of trench structure can also provide accumulated electrons in the current path when gate electrode is under positive bias for n-channel device, which can help to reduce on-resistance of this device.

In one embodiment, second accumulation MOSFET formed near the trench end can be replaced by a non-accumulation MOSFET with an isolated gate connected to the source. This structure is designed to show reduced gate to drain capacitance without changing reverse voltage blocking characteristics. In both embodiments, the short channel length of this device is formed by defining the contact trench depth, the contact implantation and subsequence anneal relating to the gate trench depth.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention are directed towards a high density power field effect transistor (FET) that reduces electron scattering due to carrier interference at the gate oxide layers. Embodiments of the present invention implement a power FET in which the high current flow of the device is primarily through the bulk silicon of the device as opposed to being along the surface of the channel (e.g., immediately adjacent to the gate oxide layer). This prevents the molecular structure of the gate oxide from inducing electron scattering. This results in a comparatively less channel mobility reduction due to gate oxide interface scattering effect for silicon device. Embodiments the present invention and their benefits are further described below.

The geometry of the features of the power MOSFET components is commonly defined photographically through photolithography. The photolithography process is used to define component regions and build up components one layer on top of another. Complex devices can often have many different built up layers, each layer having components, each layer having differing interconnections, and each layer stacked on top of the previous layer. The resulting topography of these complex devices often resemble familiar terrestrial "mountain ranges", with many "hills" and "valleys" as the device components are built up on the underlying surface of the silicon wafer. The general trend is to achieve vertical integration via more complex interconnects for lowing RC delay.

Figure 1:
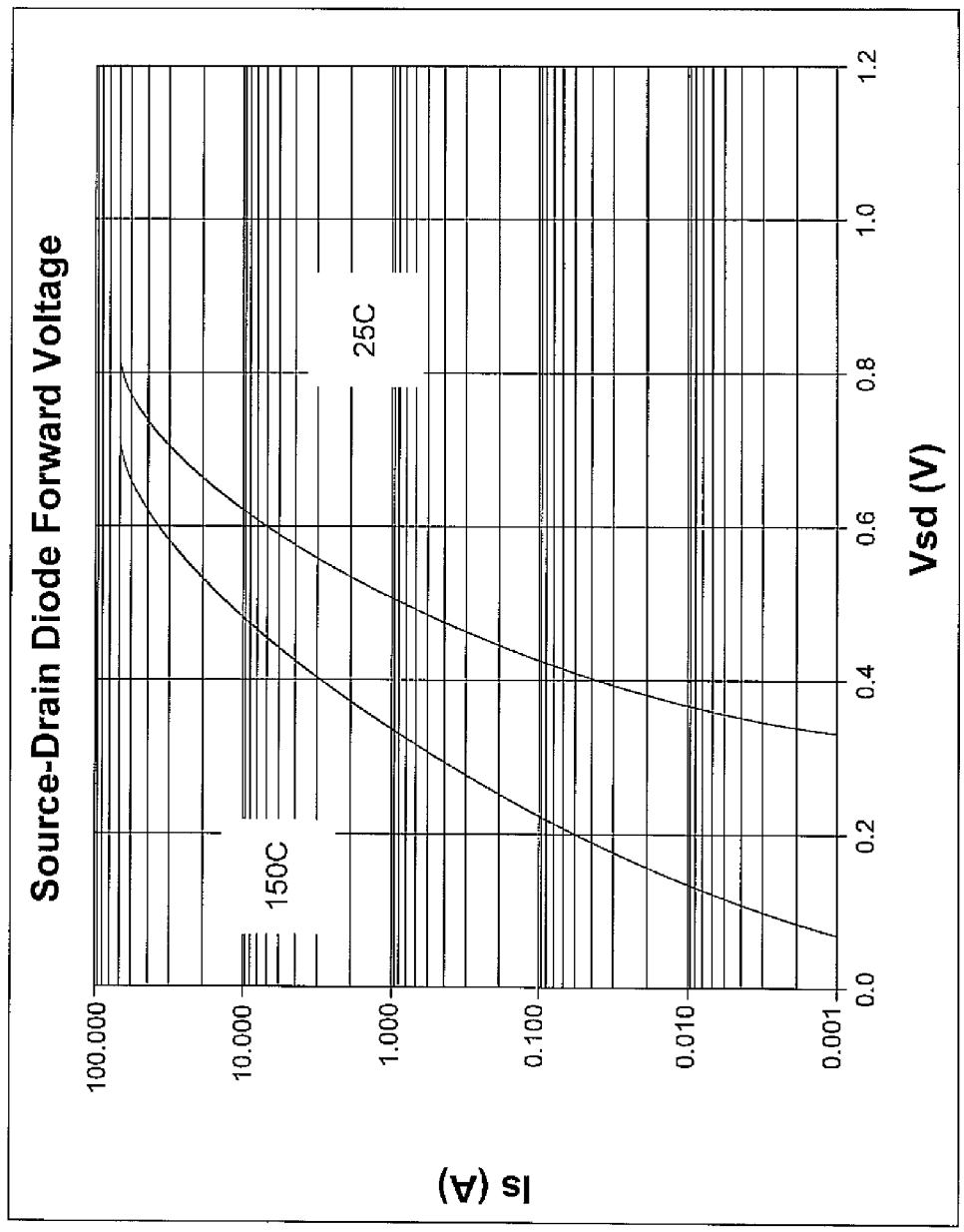
FIG. 1 shows forward voltage drop (Vf) under different current rating at two different junction temperatures of a device in accordance with one embodiment of the present invention.
Figure 2:
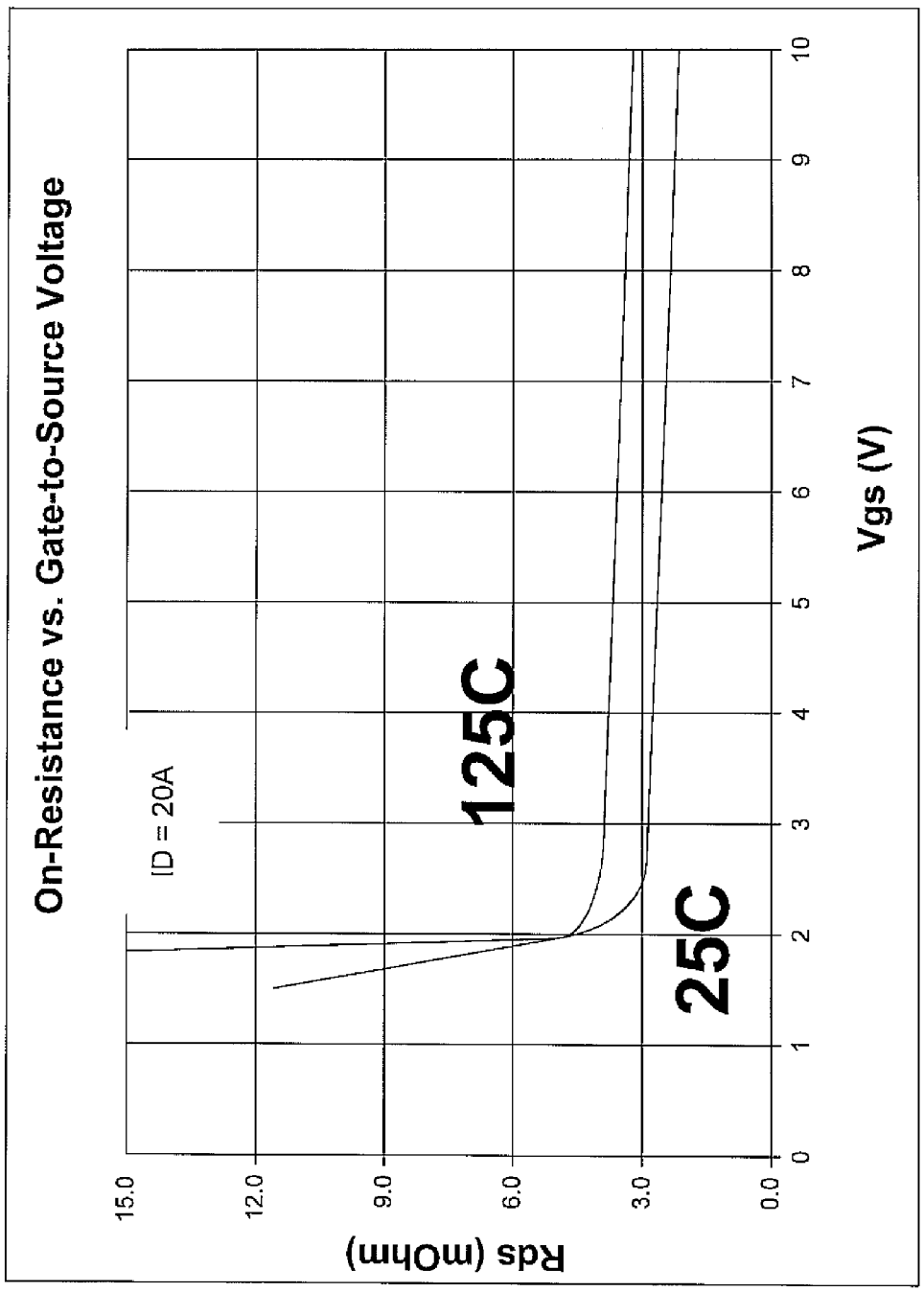
FIG. 2 shows on-resistance (Rdson) of this device measured at two different junction temperatures in accordance with one embodiment of the present invention.

FIG. 1 shows forward voltage drop (Vf) under different current rating at two different junction temperatures of a device in accordance with one embodiment of the present invention, and FIG. 2 shows on-resistance (Rdson) of this device measured at two different junction temperatures in accordance with one embodiment of the present invention.

It should be noted that advantage of a device in accordance with embodiments of the present invention is the fact that the body diode formed without the "body" formation like conventional power MOSFET. In such an embodiment, the body diode has three key components: 1) JFET; 2) vertical Schottky; and 3) p-n junction which is formed under the trench contact by implantation. This contact structure location relating to the gate trench height or depth is designed to ensure that N+ source and P+ contact are not connected, so that a vertical Schottky device can be formed between N+ source and P+ contact in a vertical geometry. As a free wheeling diode, current can flow from this body diode from "source" to "drain" when gate is grounded. In other words, the total forward voltage drop (Vf) should come from all three components with a distribution depending on each junction's configuration. With the intrinsic formation of body diode, this device can provide synchronized FET function in a freewheeling mode used in DC-DC conversion. By designing and optimizing the configuration of this body diode, a low forward voltage drop diode can be achieved at high current without Rdson trade-off in silicon real estate use. FIG. 1 shows this forward voltage drop (Vf) under different current rating at two different junction temperatures, 150 C. and 25 C. FIG. 2 exhibits on-resistance (Rdson) of this device measured at two different junction temperatures, 125 C. and 25 C.

From power device point of view, addressing its own figure of merit (FOM) rather than RC delay is the motivation to achieve different type of vertical integration mainly from the front end rather the than back end. The challenge is to integrate different devices vertically without impacting on-resistance of the device when reverse leakage is reduced. In this invention, a new structure exhibits a vertical integration of Schottky diode, junction field effect transistor (JFET) and MOSFET at accumulation mode, formed in a trench structure. Compared with conventional trench based power MOSFET, there is no body in the channel. Compared with ACCUFET (original and modified structures), forming a vertical Schottky device in conjunction with JFET device is its uniqueness. Also, the formation of JFET with a p-n diode is designed close to gate trench bottom avoiding reverse breakdown in gate oxide near the trench bottom.

Unlike conventional prior art power MOSFET which suffers from electron scattering effects due to the fact that the current flow tends to stay primarily at the surface of the device, the current flow of this vertically integrated structure is made by bulk conduction from silicon. This advantage of this device can avoid the molecular structure of the gate oxide induces electron scattering, which reduces the silicon channel mobility. Unlike ACCUFET, this device has build-in body diode even though there is no body. Compared with conventional power junction FET (JFET) which is driven by current, this device is still a voltage drive device, which can be "turned on" at relatively low drive voltage.

The three advantages of this power device over conventional power MOSFET, JFET and ACCUFET are: 1) no parasitic npn in N-ch device which can help to improve device ruggness since there is no "body" formed; 2) the "intrinsic" low forward voltage (Vf) function at high current rating can be achieved in active cells without compromising specific on-resistance; and 3) the channel length of this device is not defined by trench depth and body profile like trench power MOSFET, its channel length is much shorter in the range of 0.1 u to 0.4 u for N-ch device, defined by vertical Schottky and JFET geometries. An equivalent p-ch device can be formed if doping polarity is reversed.

Figure 3:
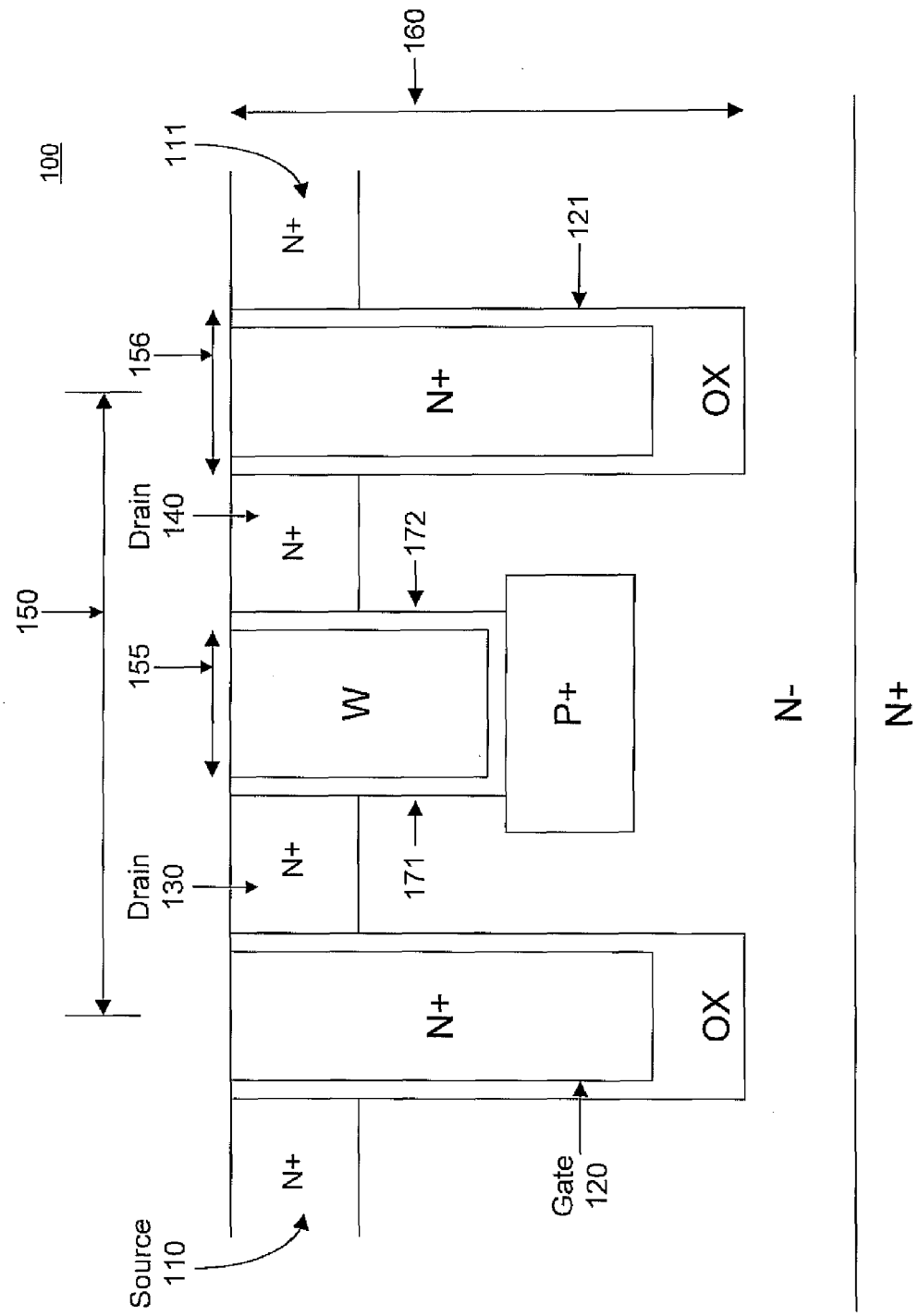
FIG. 3 shows a schematic cross-section view of a N channel power field effect transistor (FET) in accordance with a first embodiment of the present invention.

FIG. 3 shows a schematic cross-section view of a N channel power FET 100 in accordance with one embodiment of the present invention. As depicted in FIG. 3, the cross-section view of the hybrid power FET 100 shows a source 110 and 111, a drain 130 and 140, and the gates 120 and 121. The device 100 is a trench based vertical device structure. As shown in FIG. 3, the source and drain regions are N+ doped. The bulk silicon of the device is N− and the substrate itself is N+. The gates 120 and 121 are N silicon with an oxide layer as shown. At the center of the device 100, as indicated by the region 155, is a source contact. This component has a tungsten contact disposed on top of a P+ gate as shown. This source contact component also implements two Schottky regions 171 and 172. It should be noted that the bottom of the gate oxide is thicker than the side wall of the gate oxide layer. This attribute yields a lower gate to drain capacitance. The dimension 150 defines the pitch of this device, which is in the range of 2.0µ to 0.5µ. The channel length is defined by the P+ implant and subsequent anneal. The channel width is defined by the dimensions 150 and 155, and the P+ implant lateral profile.

In one exemplary embodiment, the pitch 150 between the two gates 120 and 121 is less than 1µ. The width of the contact region 155 is typically less than 0.25µ. The width of the gate region 156 is typically less than 0.25µ. The depth 160 of the device 100 from the surface to the bottom of the gate region is typically less than 1µ. Thus, the device 100 can be implemented as a very high density device. For example, the device 100 can be used to achieve densities of approximately 1 G cells per square inch, and higher. Additionally, the structure of the device 100 is suited for self alignment trench contact during the fabrication process.

The device 100 implements a "hybrid" type power MOSFET device with three major components. As used herein, the term hybrid refers to the fact that the device 100 incorporates three different types of components to provide its functionality. The first type is the two accumulation MOSFETs with the gates 120 and 121. The second type is the JFET (e.g., under the region 155) at center of the device. The third type is the two Schottky regions 171 and 172 adjacent to the drains 130 and 140.

Figure 4:
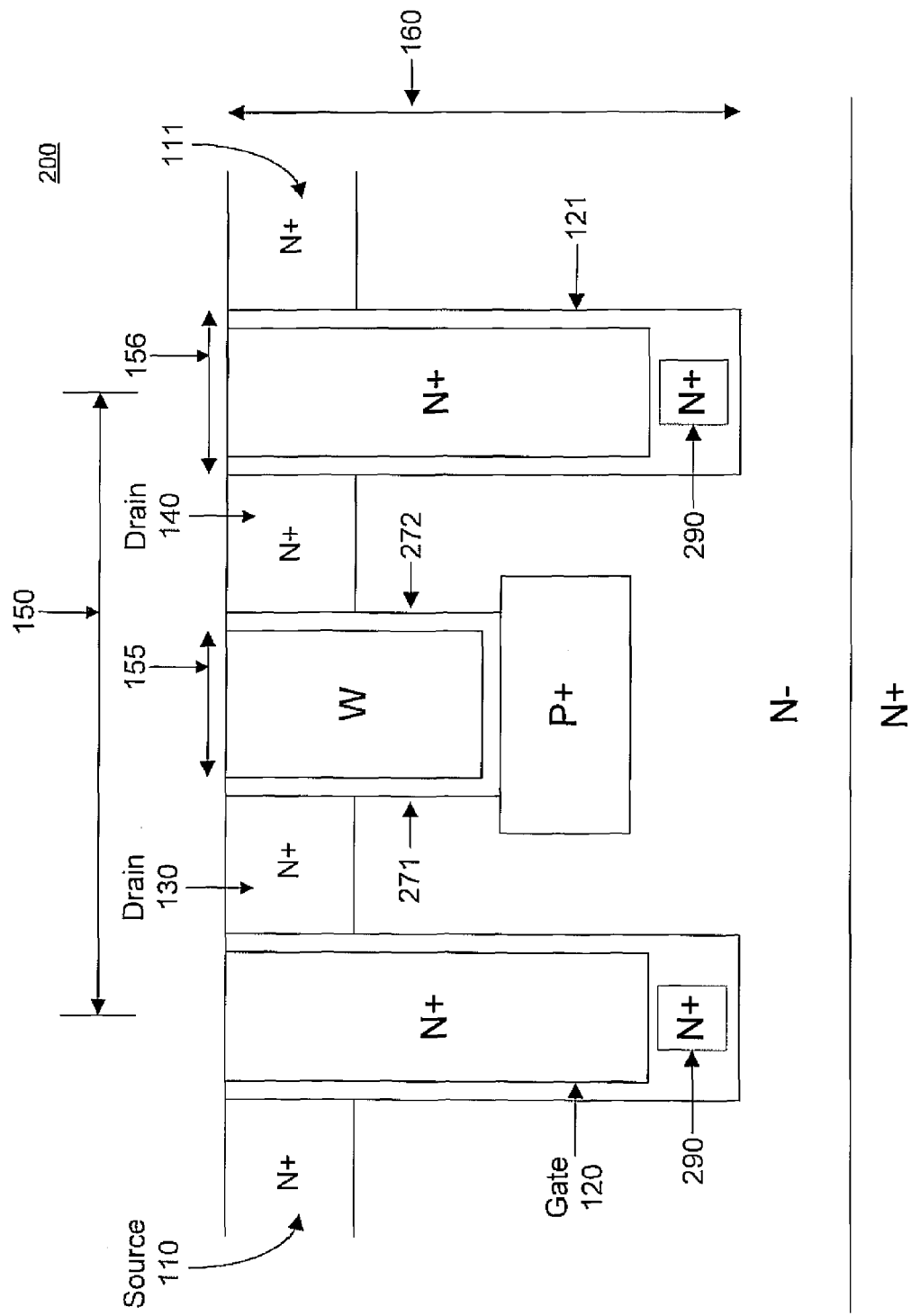
FIG. 4 shows a schematic cross-section view of a N channel power field effect transistor (FET) in accordance with a second embodiment of the present invention.

FIG. 4 shows the second embodiment with different gate configuration. FIG. 4 shows a schematic cross-section view of a N channel hybrid power FET 200 in accordance with one embodiment of the present invention. It should be noted that the bottom of the gate of device 200 is different from that of device 100. The bottom gate 290 as a second gate is isolated to connect with source. In other respects, the device 200 is substantially similar to the device 100. As shown in FIG. 4, the source and drain regions are N+ doped. The bulk silicon of the device is N− and the substrate itself is N+. The gates are N silicon with an oxide layer as shown. At the center of the device 200 is a source contact having a tungsten contact disposed on top of a P+ gate as shown. This source contact component also implements two Schottky regions 271 and 272.

Figure 5:
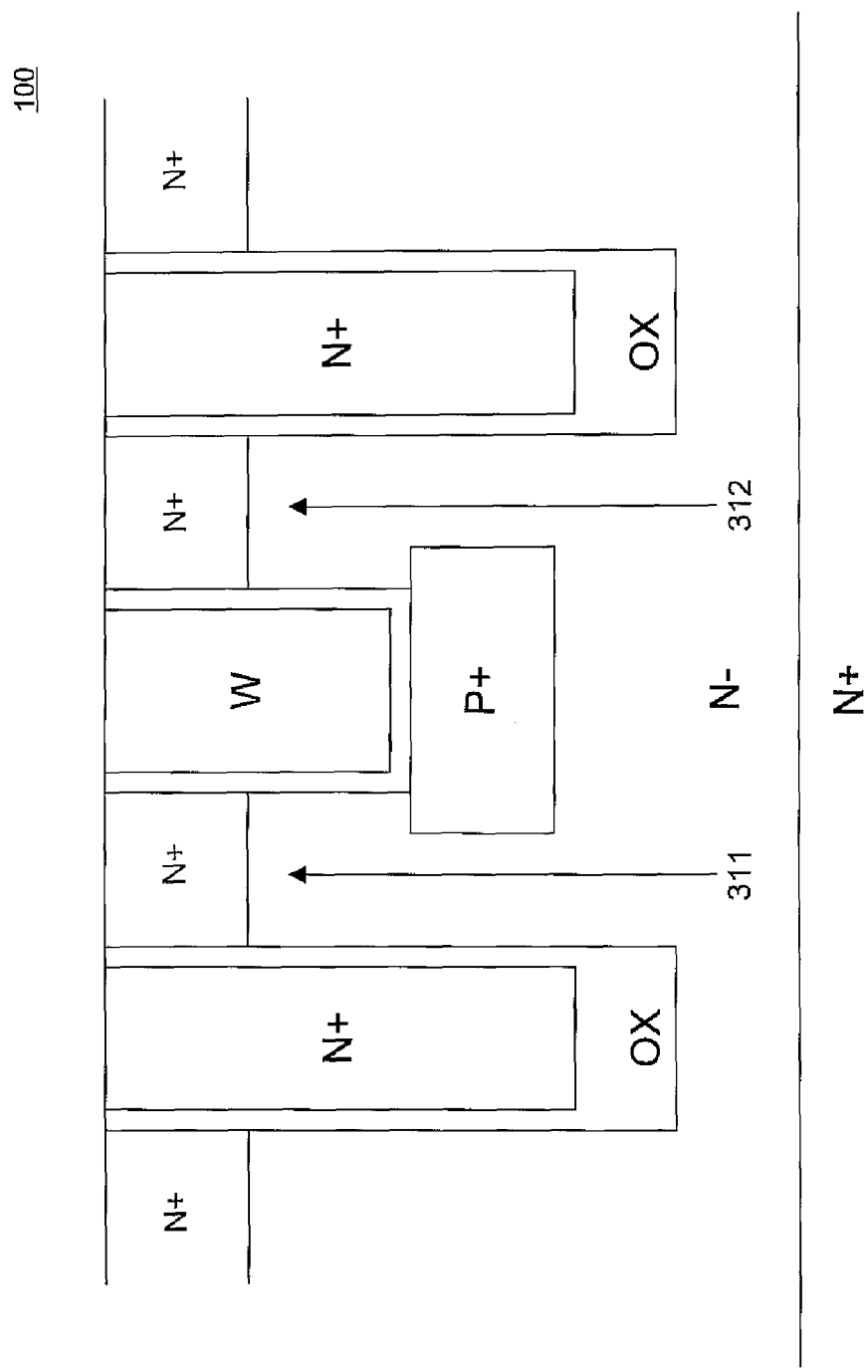
FIG. 5 shows a diagram illustrating current flow implemented by a device in accordance with one embodiment of the present invention.

FIG. 5 shows a diagram illustrating current flow implemented by the device 100 in accordance with one embodiment of the present invention. As depicted in FIG. 5, the current flows through the bulk of the silicon of the device 100. The shown by the current flow lines 311 and 312. The current flow is primarily through the bulk as opposed to being along the surface of the gate oxide. This provides a number of advantages in comparison to the prior art. The configuration of the device 100 does not have npn parasitic losses leading to a wider safe operating area. As described above, current flow is through the bulk of the device 100, which leads to less channel mobility reduction and reduced overall resistance of the device 100.

Additionally, the device 100 has a comparatively low threshold voltage. For example, in one embodiment the threshold voltage is in the range of 1.0 V to 1.1 V. The low threshold voltage allows the device to be turned on with less than two battery cells. The device 100 exhibits an improved "raggedness" in comparison to prior art devices, since there is no inversion near the gate oxide. The device 100 also exhibits a lower forward voltage at high current rating and this attribute can be obtained even without extra integrated Schottky or external Schottky diode.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A hybrid power field effect transistor device, comprising:
   a JFET component;
   a first accumulation MOSFET disposed adjacent to the JFET component;
   a second accumulation MOSFET disposed adjacent to the JFET component at a trench bottom end; and wherein the JFET component, the first accumulation MOSFET and the second accumulation MOSFET are configured to induce current flow through bulk silicon regions of the device and wherein drain regions formed at a to surface of the first accumulation MOSFET and the second accumulation MOSFET contact a vertical contact trench, and wherein a source region formed at the to surface of the first accumulation MOSFET is on an opposite side of the vertical contact trench from the drain region of the first accumulation MOSFET.

2. The device of claim 1, further comprising:
a first Schottky region disposed on a side of the JFET component; formed on a side wall of a vertical contact trench, without connecting a n+ source and a p+ contact in an n-channel device.

3. The device of claim 1, wherein the first accumulation MOSFET and the second accumulation MOSFET include a thin oxide on a side trench wall and a thick gate oxide region near a trench bottom to reduce gate to drain capacitance.

4. The device of claim 1, wherein the first accumulation MOSFET and the second accumulation MOSFET are disposed in accordance with a high-density design layout to facilitate self aligned determination.

5. The device of claim 1, wherein the induced current flow through bulk silicon regions of the device is configured to reduce gate oxide scattering.

6. The device of claim 1, wherein the first accumulation MOSFET and the second accumulation MOSFET are N channel MOSFETS.

7. The device of claim 1, wherein the JFET component, the first accumulation MOSFET and the second accumulation MOSFET are fabricated as a trench based vertical device.

8. A power MOSFET device, comprising:
a JFET component;
a first accumulation MOSFET disposed adjacent to the JFET component;
a second accumulation MOSFET disposed adjacent to the JFET component on a side opposite the first accumulation MOSFET;
wherein the JFET component, the first accumulation MOSFET and the second accumulation MOSFET are configured to induce current flow through bulk silicon regions of the device; and
wherein the JFET component, the first accumulation MOSFET and the second accumulation MOSFET are fabricated as a trench based vertical structure wherein drain regions formed at a top surface of the first accumulation MOSFET and the second accumulation MOSFET contact a vertical contact trench, and wherein a source region formed at the top surface of the first accumulation MOSFET is on an opposite side of the vertical contact trench from the drain region of the first accumulation MOSFET.

9. The device of claim 8, further comprising:
a first Schottky region disposed on a side of the JFET component; and
a second Schottky region disposed on a side of the JFET component opposite the first Schottky region.

10. The device of claim 8, wherein the first accumulation MOSFET and the second accumulation MOSFET include a thick lower oxide gate region to reduce gate to drain capacitance.

11. The device of claim 8, wherein the first accumulation MOSFET and the second accumulation MOSFET are disposed in accordance with a high-density design layout to facilitate self aligned determination.

12. The device of claim 8, wherein the induced current flow through bulk silicon regions of the device is configured to reduce gate oxide scattering.

13. The device of claim 8, wherein the first accumulation MOSFET and the second accumulation MOSFET are N channel MOSFETS.

14. The device of claim 8, wherein the first accumulation MOSFET and the second accumulation MOSFET are P channel MOSFETS.

15. A power FET device, comprising:
a JFET component;
a first accumulation MOSFET disposed adjacent to the JFET component;
a second accumulation MOSFET disposed adjacent to the JFET component on a side opposite the first accumulation MOSFET;
a first Schottky region disposed on a side of the JFET component;
a second Schottky region disposed on a side of the JFET component opposite the first Schottky region;
wherein the JFET component, the first accumulation MOSFET and the second accumulation MOSFET are configured to induce current flow through bulk silicon regions of the device and wherein drain regions formed at a to surface of the first accumulation MOSFET and the second accumulation MOSFET contact a vertical contact trench, and wherein a source region formed at the to surface of the first accumulation MOSFET is on an opposite side of the vertical contact trench from the drain region of the first accumulation MOSFET.

16. The device of claim 15, wherein the first accumulation MOSFET and the second accumulation MOSFET include a thick lower oxide gate region to reduce gate to drain capacitance.

17. The device of claim 15, wherein the first accumulation MOSFET and the second accumulation MOSFET are disposed in accordance with a high-density design layout to facilitate self aligned determination.

18. The device of claim 15, wherein the induced current flow through bulk silicon regions of the device is configured to reduce gate oxide scattering.

* * * * *